United States Patent [19]
Hirosawa

[11] Patent Number: 5,235,691
[45] Date of Patent: Aug. 10, 1993

[54] MAIN MEMORY INITIALIZING SYSTEM

[75] Inventor: Takashi Hirosawa, Tokyo, Japan

[73] Assignee: Oki Electric Industry Co., Ltd., Tokyo, Japan

[21] Appl. No.: 575,960

[22] Filed: Aug. 31, 1990

[30] Foreign Application Priority Data

Sep. 1, 1989 [JP] Japan .................. 61-224522

[51] Int. Cl.[5] .................. G06F 12/16; G06F 1/08
[52] U.S. Cl. .................. 395/425; 364/DIG. 1;
364/238.4; 364/246; 364/246.4; 364/246.91;
364/254.8; 364/270; 364/270.2
[58] Field of Search ... 364/200 MS File, 900 MS File;
395/425, 400, 550

[56] References Cited

U.S. PATENT DOCUMENTS

| | | | |
|---|---|---|---|
| 4,006,468 | 2/1977 | Webster | 340/173 |
| 4,236,207 | 11/1980 | Rado et al. | 364/200 |
| 4,754,425 | 6/1988 | Bhadriraju | 364/900 |
| 4,796,232 | 1/1989 | House | 365/189 |
| 4,901,283 | 2/1990 | Hanbury et al. | 365/222 |

FOREIGN PATENT DOCUMENTS 54-121627 9/1979 Japan .

Primary Examiner—Rebecca L. Rudolph
Attorney, Agent, or Firm—Edward D. Manzo; John J. King

[57] ABSTRACT

A main memory control system has an initial data generating circuit for generating initial data, an initialization control circuit for activating an initialize signal in response to an initialize command, and a refresh control circuit that generates refresh addresses. When the initialize signal is inactive, the main memory control system performs normal read, write, and refresh operations. When the initialize signal is active, the main memory control system selects the initial data by means of a data multiplexer and performs only write operations, writing the initial data at refresh addresses generated by the refresh control circuit. If the main memory has an interleaved structure, the initial data are written in all banks simultaneously.

15 Claims, 4 Drawing Sheets

MAIN MEMORY INITIALIZING SYSTEM

BACKGROUND OF THE INVENTION

This invention relates to a main memory control system for controlling the main memory of a computer, more particularly to a system with improved means of initializing the main memory.

The main memory of a modern computer generally comprises dynamic random access memory elements which must be periodically refreshed by reading the data stored in the memory elements and writing the same data again in the same locations. The refreshing process is controlled by a main memory control system, which also controls access to the main memory by the computer's central processing unit. In addition, when the computer's power is switched on, before the main memory is used it is initialized by writing initial data, such as zero, in all memory locations.

One initialization method uses software. A program contains a loop that generates successive addresses covering the entire address range of the main memory unit, and writes initial data at these addresses one by one. Such a program can be stored in the computer's control memory, or incorporated into its operating-system software, so this method does not require any extra hardware. The time taken by the central processing unit to execute the instructions in the loop, however, makes this method slow, taking as long as half an hour to initialize a large main memory.

Another method employs special initialization hardware in the main memory control system. The hardware comprises a circuit such as a counter for generating successive main memory addresses, another circuit for generating initial data to be written at these addresses, and further circuits for writing the data at the generated addresses. Another requirement is a three-to-one multiplexer for selecting addresses and data from the central processing unit for ordinary access, addresses and data from the special hardware for initialization, or refresh addresses.

Existing special hardware systems can initialize a main memory much faster than can software, but the amount of special hardware required adds significantly to the size and cost of the main memory control system. Moreover, in computers with very large main memories, even this special hardware is not as fast as could be desired.

SUMMARY OF THE INVENTION

It is accordingly an object of the present invention to initialize the main memory of a computer rapidly, using only simple additional hardware.

Another object of the present invention is to initialize all leaves (banks) of an interleaved main memory simultaneously.

A main memory control system has an initial data generating means for generating initial data, and an initialization control means for activating an initialize signal in response to an initialize command. A refresh control means generates refresh addresses and activates a refresh timing signal at selectable refresh intervals, selecting one refresh interval when the initialize signal is inactive and a shorter refresh interval when the initialize signal is active. A main memory control means selects refresh addresses when the refresh timing signal is active and addresses received from a central processing unit when the refresh timing signal is inactive, selects the initial data when the initialize signal is active and data received from or sent to the central processing unit when the initialize signal is inactive, and generates control signals for writing the selected data at the selected addresses in the main memory.

If the main memory has an interleaved structure, when the initialize signal is active the main memory control means generates control signals for writing the selected data in all leaves (banks) simultaneously.

DETAILED DESCRIPTION OF THE INVENTION

Figure 1:
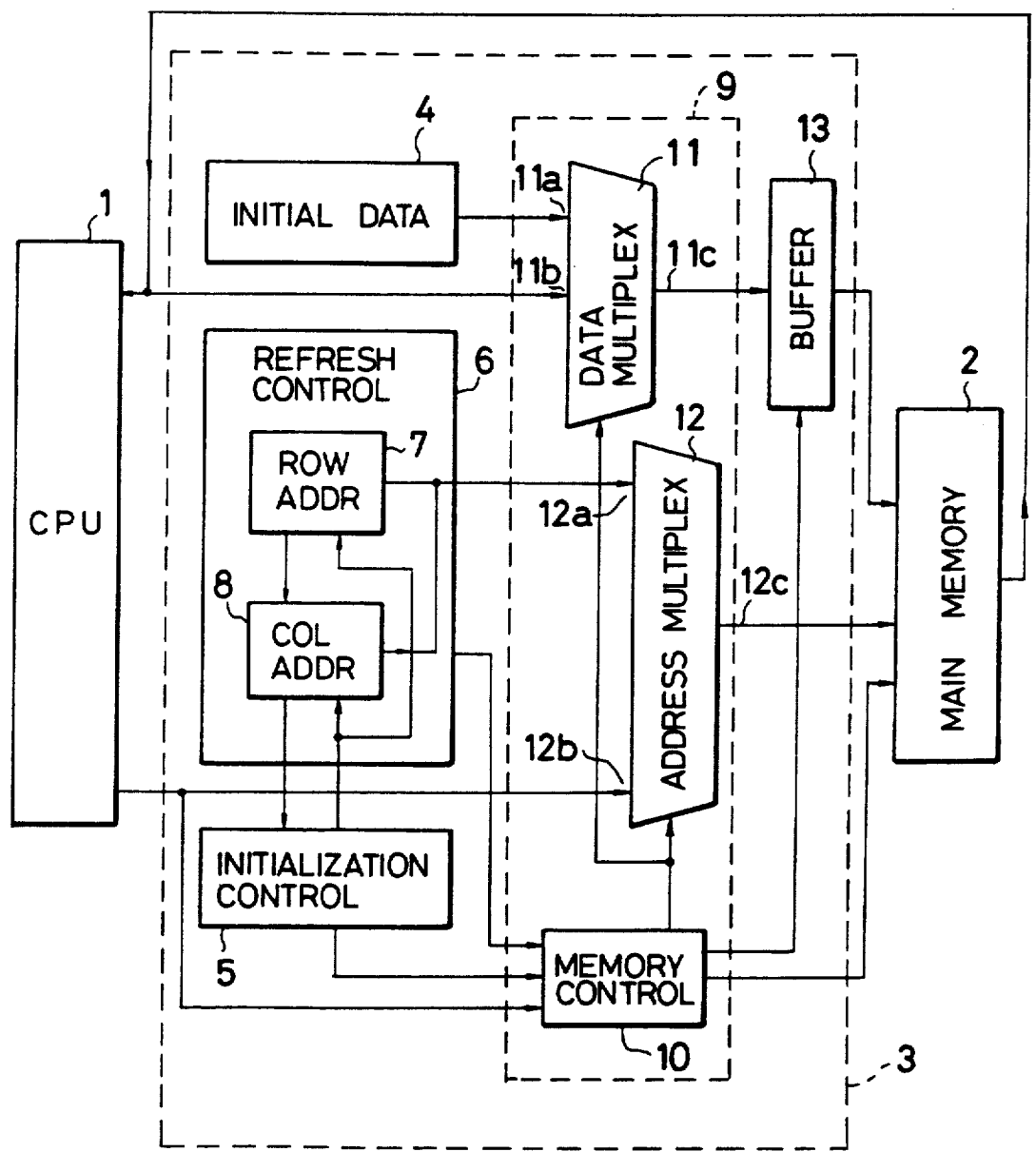
FIG. 1 is a block diagram of the invented main memory control system.

The invented main memory control system will be described with reference to an embodiment shown in the drawings. The drawings do not restrict the scope of the invention, which should be determined solely from the appended claims.

With reference to FIG. 1, a computer has a central processing unit 1 for processing data, a main memory 2 for storing data, and a main memory control system 3 for controlling access to the main memory 2 by the central processing unit 1. The main memory control system 3 also refreshes and initializes the main memory 2, as will be described below. Access to the main memory 2 is performed by a sequence of operations referred to generally as a memory cycle and specifically as a read cycle, write cycle, or refresh cycle, depending on the type of access.

The main memory 2 comprises semiconductor memory elements such as dynamic random access memory chips. Locations in the main memory 2 are specified by addresses comprising two parts, a row address and a column address, which are sent one after the other on the same signal lines. The main memory 2 first latches the row address, then latches the column address and accesses the unique memory location identified by the row and column addresses.

The main memory control system 3 has an initial data generating means 4 for generating initial data. In general the initial data will be identical words comprising all one's or all zero's, in which case the initial data generating means 4 can have an extremely simple structure. For example, if the initial data comprise words of all zero's, represented by the low logic level, the initial data generating means 4 may simply comprise terminals connected to a ground line of the computer. If the initial data comprise words of all one's, represented by the high logic level, the initial data generating means 4 may comprise terminals connected to one of the computer's power supply lines.

The main memory control system 3 also has an initialization control means 5, which is connected to the central processing unit 1. When the computer's power is switched on, or at other times when memory must be initialized, the initialization control means 5 receives an initialize command from the central processing unit 1 and responds by activating an initialize signal.

The main memory control system 3 also has a refresh control means 6 connected to initialization control means 5, for generating refresh addresses and activating a refresh timing signal at selectable refresh intervals. When the initialize signal is inactive, the refresh control means 6 selects an interval that need only be less than the required refresh interval of the memory elements in the main memory 2, such as an interval of about 16 μs. When the initialize signal is active, however, the refresh control means 6 selects a shorter refresh interval, generally equal to the length of one memory cycle, such as 400 nanoseconds.

The refresh control means 6 comprises a row address counter 7 for generating row addresses, and a column address counter 8 for generating column addresses. The row address counter 7 is incremented once per refresh timing signal output; the column address counter 8 is incremented once each time the row address counter overflows. These counters are arranged so that the refresh addresses output by the refresh control means 6 cycle through the entire range of addresses in the main memory 2.

Both the row address counter 7 and the column address counter 8 are reset to a value such as zero when the initialize signal changes from inactive to active. When the column address counter 8 overflows, it sends an overflow signal to the initialization control means 5 which causes the initialization control means 5 to deactivate the initialize signal.

The main memory control system 3 also has a memory control means 9 connected to the refresh control means 6, the initialization control means 5, the initial data generating means 4, the main memory 2, and the central processing unit 1. One function of the memory control means 9 is to select data and addresses according to refresh timing signals and initialize signals received from the refresh control means 6 and the initialization control means 5, and provide the selected data and addresses to the main memory 2. Specifically, the memory control means 9 selects refresh addresses when the refresh timing signal is active and addresses received from central processing unit when said refresh timing signal is inactive. It selects initial data when the initialize signal is active and data received from or sent to the central processing unit when the initialize signal is inactive.

The memory control means 9 also receives read and write commands from the central processing unit 1, arbitrates between these commands and the refresh timing signals received from the refresh control means 6, and generates control signals for various types of memory cycles.

The memory control means 9 comprises a main memory control circuit 10, a data multiplexer 11, and an address multiplexer 12. The main memory control circuit 10 receives read and write commands, refresh timing signals, and initialize signals, performs the arbitration and control functions mentioned above, and controls the data multiplexer 11 and the address multiplexer 12.

The data multiplexer 11 has first input terminals 11a connected to the initial data generating means 4, second input terminals 11b connected to the central processing unit 1, and output terminals 11c connected to the main memory 2. Under control of the main memory control circuit 10, the data multiplexer 11 selects either its first input terminals 11a or its second input terminals 11b and connects the selected input terminals to the output terminals 11c, thus supplying selected data to the main memory 2.

The address multiplexer 12 has first input terminals 12a connected to the refresh control means 6, second input terminals 12b connected to the central processing unit 1, and output terminals 12c connected to the main memory 2. Under control of the main memory control circuit 10, the address multiplexer 12 selects either its first input terminals 12a or its second input terminals 12b and connects the selected input terminals to the output terminals 12c, thus supplying selected addresses to the main memory 2.

The main memory control system 3 also comprises a write buffer 13, disposed between the data multiplexer 9 and the main memory 2 and connected to the main memory control circuit 10, for temporarily storing data to be written in the main memory 2. In general the write buffer 13 latches the data from the data multiplexer 11 in every write cycle, but when the initialize signal changes from inactive to active, the main memory control circuit 10 causes the write buffer 13 to latch the initial data received from the initial data generating means 4 via the data multiplexer 11 only once, holding this initial data thereafter until the initialize signal changes from active to inactive.

Next the operation of the main memory control system 3 in FIG. 1 will be described.

When the refresh timing signal and initialize signal are both inactive, the main memory control circuit 10 causes the data multiplexer 11 and the address multiplexer 12 to select their second inputs, selecting data and addresses from the central processing unit 1. When the main memory control circuit 10 receives a write command from the central processing unit 1, it generates control signals for a write cycle, causing data received from the central processing unit 1 to be latched in the write buffer 13 and written in the main memory 2 at an address received from the central processing unit 1. When the main memory control circuit 10 receives a read command from the central processing unit 1, it generates control signals for a read cycle, causing data stored in the main memory 2 at an address received from the central processing unit 1 to be output from the main memory 2 to the central processing unit 1.

When the refresh control means 6 activates the refresh timing signal, the main memory control circuit 10 commands the address multiplexer 12 to select its first input, thus selecting a refresh address output from the refresh control means 6. Then the main memory control circuit 10 generates control signals for a refresh cycle, causing data stored at the refresh address to be read and rewritten at the same location. If the refresh timing signal coincides with a read or write command from the central processing unit 1, the main memory control circuit 10 arbitrates between them so that only one type of memory cycle is carried out at a time. The refresh interval is long enough to allow read and write cycles to be performed between refresh cycles.

Refreshing can be performed by several methods. In one method, known as the scrubbing refresh, the control signals generated by the main memory control circuit 10 cause the main memory 2 to output the data stored at the refresh address, the write buffer 13 to latch the output data which it receives via the data multiplexer 11, and the main memory 2 to write the data back at the same address. Thus only one address can be refreshed at a time.

Other methods of refreshing make use of the row and column structure of the addresses in the main memory 2. In one of these methods, known as the RAS-only refresh, the refresh control means 6 outputs only row addresses, and all memory locations in the same row are refreshed simultaneously. The refresh is performed internally by the memory elements in the main memory 2, without looping data through the data multiplexer 11 and write buffer 13.

When the central processing unit 1 sends an initialize command to the initialization control means 5, the initialization control means 5 activates the initialize signal and the main memory control circuit 10 causes both the data multiplexer 11 and the address multiplexer 12 to select their first inputs, thus selecting the initial data generated by the initial data generating means 4 and the refresh addresses output by the refresh control means 6. The initial data are latched and held in the write buffer 13.

When the refresh control means 6 receives the active initialize signal from the initialization control means 5, it shortens the refresh interval and resets the row address counter 7 and the column address counter 8. Then it commences output of successive refresh addresses in every memory cycle, each refresh address comprising both row and column addresses. Each refresh address output is accompanied by a refresh timing signal.

When the main memory control circuit 10 receives a refresh timing signal while the initialize signal is active, it generates control signals for a write cycle. Thus the initial data generated by the initial data generating means 4 are written at successive addresses in the main memory 2. Initialization is accomplished quickly because every memory cycle is a write cycle; no cycles are spent reading or processing instructions.

When the column address counter 8 in the refresh control means 6 overflows, signifying that all addresses have been initialized, the initialization control means 5 deactivates the initialize signal, ending the initialization operation. The main memory control circuit 10 then commands the data multiplexer 11 and the address multiplexer 12 to select data and addresses from the central processing unit 1 again, and the refresh control means 6 reverts to the normal refresh interval.

Figure 2:
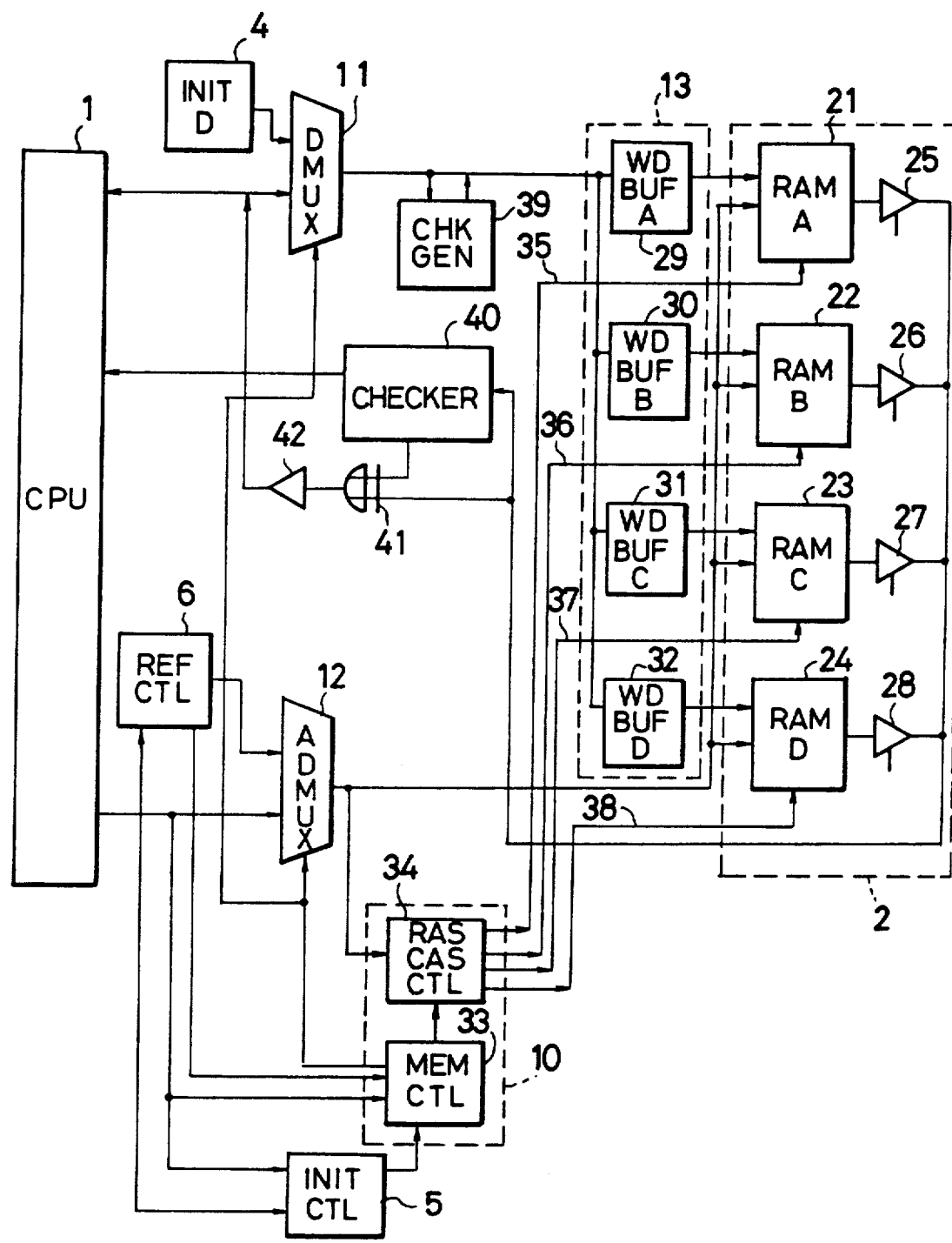
FIG. 2 is a more detailed block diagram of the invented main memory control system.

A more detailed description of the structure of the main memory 2 and the memory control means 9 will next be given with reference to FIG. 2. In FIGS. 1 and 2, identical reference numerals designate identical elements.

The main memory 2 in FIG. 2 has an interleaved structure comprising four leaves 21, 22, 23, and 24. The number of leaves is not restricted to four; there can be any number of leaves greater than one. The leaves 21, 22, 23, and 24 have respective read data drivers 25, 26, 27, and 28 for sending data read from the main memory 2 to the central processing unit 1. The write buffer 13 comprises four write buffers 30, 31, 32, and 33, each supplying data to one leaf of the main memory 2.

Addresses are assigned to the four leaves 21, 22, 23, and 24 in such way that successive addresses are disposed in different leaves. This arrangement is commonly used to enable high-speed access to the main memory of a computer.

The main memory control circuit 10 comprises a memory control circuit 33 and a RAS-CAS control circuit 34. The memory control circuit 33 receives the refresh timing signals and initialize signals and controls the data multiplexer 11, the address multiplexer 12, and the RAS-CAS control circuit 34. The RAS-CAS control circuit 34 generates control signals causing the main memory 2 to latch addresses received from the address multiplexer 12. More specifically, the RAS-CAS control circuit 34 supplies three types of control signals to the main memory 2: a Row Address Strobe signal (RAS*); a Column Address Strobe (CAS*); and a Write Enable signal (WE*). The asterisks indicate that these signals are active low. Separate RAS*, CAS*, and WE* signals are output for each of the four memory leaves 21, 22, 23, and 24, using separate control buses 35, 36, 37, and 38.

When the RAS* signal changes from inactive to active, (from high to low), the main memory 2 latches the address from the address multiplexer 12 in a row address decoder circuit. When the CAS* signal changes from inactive to active, (from high to low), the main memory 2 latches the address from the address multiplexer 12 in a column row address decoder circuit. In addition, if the WE* signal is active when CAS* changes from inactive to active, the main memory 2 writes data received from the data multiplexer 11 via the write buffer 13 at a location indicated by the row and column addresses. The row and column address decoder circuits are not explicitly shown in the drawings, as they are standard components of the memory elements in the main memory 2.

The RAS-CAS control circuit 34 is connected not only to the memory control circuit 33 and the main memory 2 but also to the address multiplexer 12, from which it receives part of the address information. Specifically, it receives two address bits designating one of the memory leaves. In a memory cycle for access by the central processing unit 1, the RAS-CAS control circuit 34 selects one of the four leaves 21, 22, 23, and 24 according to the received address information, and outputs RAS*, CAS*, and WE* signals only to the selected leaf.

The main memory control system in FIG. 2 also comprises a check bit generator 39 for adding error checking and correcting information to the data output by the data multiplexer 11, and a checker 40 for checking data read from the main memory 2. Data read from the main memory 2 are supplied to the checker 40 and to an exclusive-OR gate 41. If the checker 40 finds an error, it notifies the central processing unit 1 and, if possible, applies signals to the exclusive-OR gate 41 to correct the error. The corrected data are fed from the exclusive-OR gate 41 to a bus read driver 42, thence to the central processing unit 1 and the data multiplexer 11.

The main memory control system in FIG. 2 operates as already described in FIG. 1, but when the initialize signal is active, the memory control circuit 33 causes the RAS-CAS control circuit 34 to output RAS*, CAS*, and WE* signals to all four leaves 21, 22, 23, 24 simultaneously. Thus during initialization, the memory control means 9 writes the data selected by the data multiplexer 11, namely the initial data output from the initial data generating means 4, in all of the leaves simultaneously, speeding up the initialization process by a factor of four. The address counters in the refresh control means 6 are controlled to take account of this multiple writing.

Figure 3:
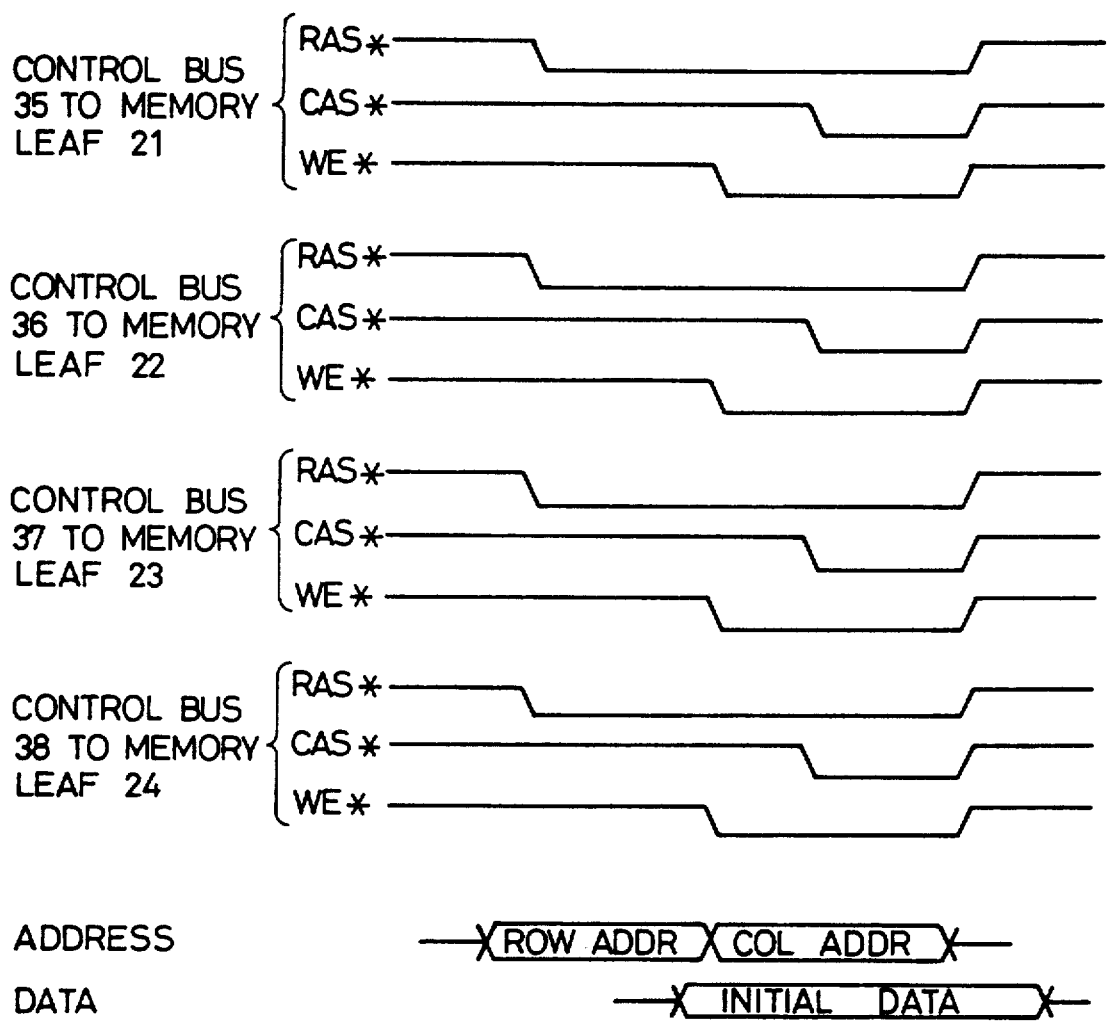
FIG. 3 is a timing diagram illustrating control signals output during initialization.

FIG. 3 shows the timing of the RAS*, CAS*, and WE* signals during initialization. When the memory control circuit 33 receives a refresh timing signal from the refresh control means 6, it causes the RAS-CAS control circuit 34 to activate all four RAS* signals simultaneously, then to activate all four WE* signals simultaneously, then to activate all four CAS* signals simultaneously. The RAS*, CAS*, and WE* signals are deactivated simultaneously at the end of the memory cycle. The write cycle shown in FIG. 3 is known as an early write cycle, because the write data are latched as soon as the CAS* signal becomes active.

Figure 4:
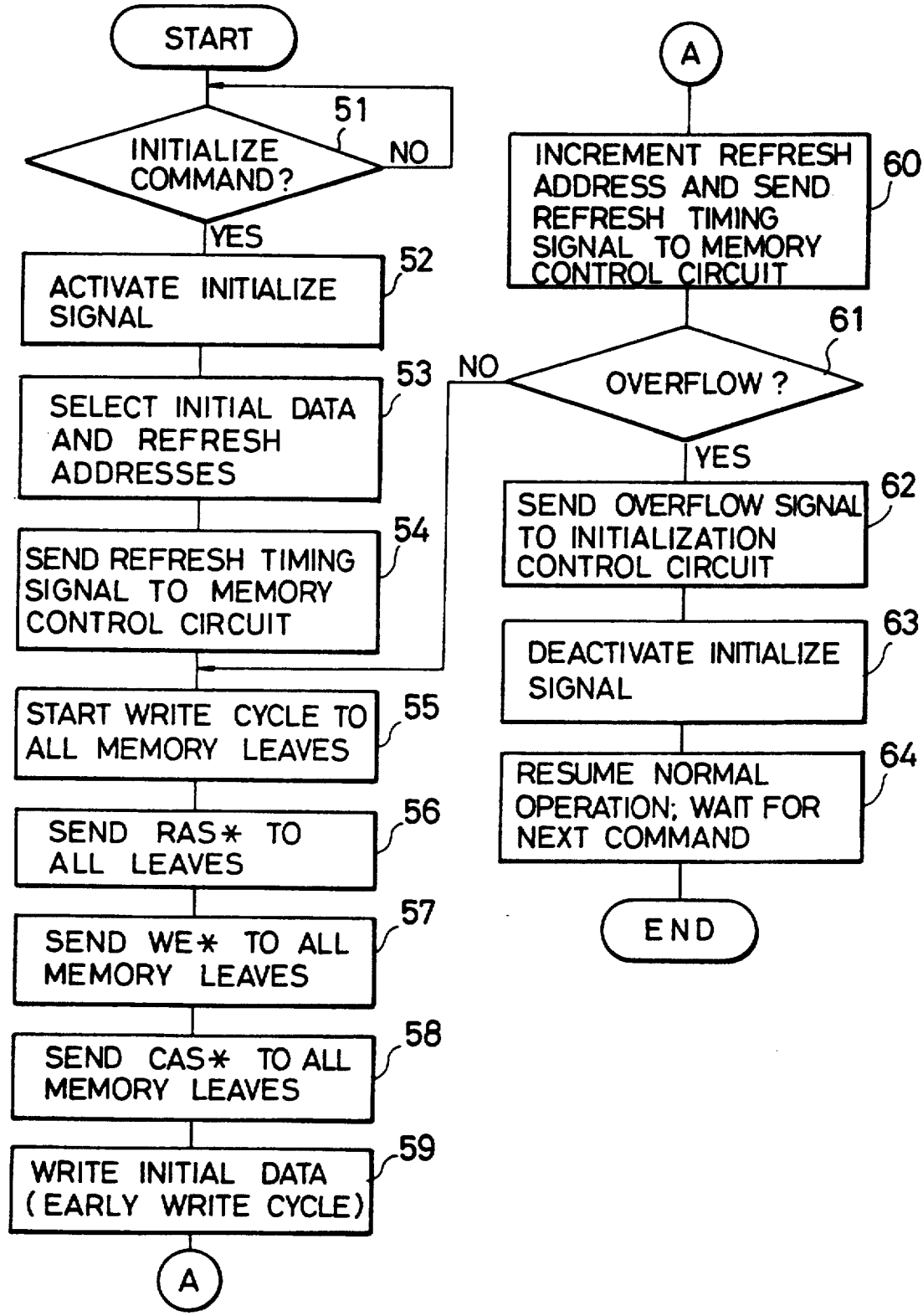
FIG. 4 is a flowchart illustrating the initialization procedure.

FIG. 4 is a flowchart illustrating the initialization procedure.

At the beginning of this procedure, the initialization control means 5 waits for an initialize command from the central processing unit 1 (step 51). When an initialize command arrives, the initialization control means 5 activates the initialize signal (step 52), causing the refresh control means 6 to reset its counters and shorten the refresh interval. The initialize signal is also sent to the memory control circuit 33 in FIG. 3. When the initialize signal changes becomes active, the memory control circuit 33 commands the data multiplexer 11 to select the initial data from the initial data generating means 4, and the address multiplexer 12 to select refresh addresses from the refresh control means 6 (step 53).

The refresh control means 6 now sends a refresh timing signal to the memory control circuit 33 (step 54). Since the initialize signal is active, the memory control circuit 33 responds to the refresh timing signal by commanding the RAS-CAS control circuit 34 to send control signals for a write cycle to all memory leaves (step 55). The RAS-CAS control circuit 34 responds by driving the RAS* signals to all four memory leaves to the active state (step 56). The refresh control means 6 sends a row address to the address multiplexer 12 at this time. Next the RAS-CAS control circuit 34 drives the WE* signals to all four memory leaves to the active state (step 57). Then the RAS-CAS control circuit 34 drives the CAS* signals to all four memory leaves to the active state (step 58). The refresh control means 6 sends a column address to the address multiplexer 12 at this time. The main memory 2 responds to this early write cycle by writing the initial data at four addresses simultaneously, one address in each leaf (step 59).

Next the refresh control means 6 increments the refresh address and sends another refresh timing signal to the memory control circuit 33 (step 60). If incrementation of the refresh address does not cause a column address overflow, the procedure returns to step 55 to start another early write cycle.

If the column address counter overflows, an overflow signal is sent to the initialization control means 5 (step 62). The initialization control means 5 responds by deactivating the initialize signal (step 63). The refresh control means 6 and the memory control circuit 33 then revert to normal operation. The memory control circuit 33 waits for the next command from the central processing unit 1 or the next refresh timing signal from the refresh control means 6 (step 64).

During the initialization process the main memory 2 is also refreshed, all addresses in a given row being refreshed simultaneously in each cycle in which the row address counter 7 in the refresh control means 6 specifies that row.

By initializing all memory leaves simultaneously, the invented main memory control system can complete the initialization procedure faster than existing hardware initialization systems that initialize only one address at a time, and much faster than existing software initialization systems. Yet the invented main memory control system requires very little additional hardware for initialization. The initial data generating means 4 can have an extremely simple structure, as already described. The data multiplexer 11 that selects the initial data generating means 4 can be a simple type of switch. The initialization control means 5 can also be simple in structure, since it only has to control two circuits, the refresh control means 6 and the memory control circuit 33 (the main memory control circuit 10 in FIG. 1).

The refresh control means 6 has been described as generating a single initialize signal, which it sends to both the refresh control means 6 and the memory control circuit 33. Depending on the structure of the refresh control means 6 and the memory control circuit 33, the refresh control means 6 may have to generate a plurality of signals: one signal to reset the counters in the refresh control means 6, another signal to select the short refresh interval in the refresh control means 6, and other signals to control the memory control circuit 33. The circuit for generating this plurality of signals will still be simple, however, because it has only two inputs: the initialize command from the central processing unit 1 and the overflow signal from the refresh control means 6.

This invention is not restricted any particular method of refreshing. The scrubbing refresh, the RAS-only refresh, or other well-known methods such as the CAS-before-RAS refresh or hidden refresh can be used. The point of the invention is to use the refresh addresses generated by any of these methods for initialization of the main memory. Modifications for using various refresh methods will be apparent to one skilled in the art.

What is claimed is:

1. A main memory initializing system for controlling access to a main memory of a computer by a central processing unit of the computer, and for refreshing and initializing the main memory, comprising:

an initial data generating means for generating initial data;

an initialization control means connected to said central processing unit, for receiving an initialize command from said central processing unit and activating an initialize signal in response thereto;

a refresh control means connected to said initialization control means for generating refresh addresses and a timing interval, said timing interval selected from a refresh timing interval and an initializing timing interval which is shorter than said refresh timing interval, wherein said refresh control means selects said refresh timing interval when said initialize signal is inactive, while said refresh control means selects said initializing timing interval when said initialize signal is active;

a memory control means connected to said refresh control means, said initial data generating means, said initialization control means, said main memory, and said central processing unit for selecting said refresh addresses when said refresh timing interval is output from said refresh control means and addresses received from said central processing unit when said initializing timing interval is output from said refresh control means, for selecting said initial data when said initialize signal is active and data received from or sent to said central processing unit when said initialize signal is inactive, and for generating control signals for writing the selected data at the selected addresses in said main memory;

wherein said main memory has an interleaved structure comprising a plurality of banks, and said memory control means writes said selected data simultaneously in each of said banks when said initialize signal is active.

2. The system of claim 1, wherein said initial data generating means comprises terminals connected to a power supply line of said computer, for supplying a high logic level to said memory control means.

3. The system of claim 1, wherein said initial data generating means comprises terminals connected to a ground line of said computer, for supplying a low logic level to said memory control means.

4. The system of claim 1, wherein said refresh control means comprises a row address counter for generating row addresses and a column address counter for generating column addresses, said row address counter incrementing once per said refresh timing interval, and said column address counter incrementing once per overflow of said row address counter.

5. The system of claim 4, wherein said refresh control means sends an overflow signal to said initialization control means when said column address counter overflows.

6. The system of claim 5, wherein said initialization control means deactivates said initialize signal in response to said overflow signal.

7. The system of claim 4, wherein said memory control means comprises:
- a data multiplexer having first input terminals connected to said initial data generating means, second input terminals connected to said central processing unit, and first output terminals connected to said main memory, said data multiplexer selecting said first input terminals or said second input terminals and connecting the selected input terminals to said first output terminals;
- an address multiplexer having third input terminals connected to said refresh control means, fourth input terminals connected to said central processing unit and second output terminals connected to said main memory, said address multiplexer selecting said third input terminals or said fourth input terminals and connecting the selected input terminals to said second output terminals;
- a RAS-CAS control circuit for generating control signals causing said main memory to latch addresses received from said address multiplexer; and
- a memory control circuit for controlling said data multiplexer, said address multiplexer, and said RAS-CAS control circuit according to said timing interval received from said refresh control means.

8. The system of claim 7 wherein said RAS-CAS control circuit generates a Row Address Strobe signal, a Column Address Strobe signal, and a Write Enable signal.

9. The system of claim 8, wherein said main memory latches row and column addresses from said address multiplexer when said Row Address Strobe signal and said Column Address Strobe signal change from inactive to active, and latches data from said data multiplexer when said Column Address Strobe signal changes from inactive to active provided said Write Enable signal is also active, and latched data being written at a location indicated by the latched row and column addresses.

10. The system of claim 9, wherein said initialize signal is active, said memory control circuit causes said RAS-CAS control circuit to activate said Row Address Strobe signal, then activate said Write Enable signal, then activate said Column Address Strobe signal, then deactivate said Row Address Strobe signal, said Write Enable signal, and said Column Address Strobe signal simultaneously within said refresh timing interval.

11. The system of claim 8, wherein said main memory has an interleaved structure comprising a plurality of banks, and said RAS-CAS control circuit sends said Row Address Strobe, Column Address Strobe, and Write Enable signals separately to each bank.

12. The system of claim 11 wherein, when said initialize signal is active, said memory control circuit causes said RAS-CAS control circuit to send said Row Address Strobe, Column Address Strobe, and Write Enable signals to all banks simultaneously.

13. The system of claim 1, further comprising a write buffer disposed between said memory control means and said main memory for storing data to be written in said main memory.

14. The system of claim 13, wherein said initial data are stored in said write buffer when said initialize signal changes from inactive to active, after which data in said write buffer are not updated until said initialize signal changes from active to inactive.

15. A main memory initializing system for controlling access to a main memory by a processing unit and for refreshing and initializing the main memory comprising:
- an initial data supplying circuit;
- an initialization control circuit coupled to provide an INITIALIZE signal;
- a refresh control circuit coupled to said initialization control circuit and responsive to the INITIALIZE signal for generating REFRESH timing signals having a first duration while refreshing the main memory and a second, shorter, duration while initializing the main memory, and including a refresh address generator providing refresh addresses; and
- a memory control circuit coupled to the refresh control circuit, the initial data supplying circuit, and the main memory, and including an address input and a data input, each connected to said processing unit,
- the memory control circuit being responsively coupled to said REFRESH timing signal and said INITIALIZE signal for coupling to the main memory either said refresh addresses received from said refresh control circuit or addresses received at said address input and for coupling to the main memory either data received from said initial data supplying circuit or data received at the data input,
- the memory control circuit also including a memory controller coupled to provide WRITE CONTROL signals to the main memory.

* * * * *

UNITED STATES PATENT AND TRADEMARK OFFICE
CERTIFICATE OF CORRECTION

PATENT NO. : 5,235,691

DATED : August 10, 1993

INVENTOR(S) : Takashi Hirosawa

It is certified that error appears in the above-identified patent and that said Letters Patent is hereby corrected as shown below:

On the title page: Item [30]

Foreign Application Priority Data,
"61-224522" should read --01-224522--.

Signed and Sealed this

Twenty-second Day of March, 1994

Attest:

BRUCE LEHMAN

Attesting Officer

Commissioner of Patents and Trademarks